United States Patent [19]
Morich et al.

[11] Patent Number: 5,485,087
[45] Date of Patent: Jan. 16, 1996

[54] MAGNETIC RESONANCE INSERT GRADIENT COILS WITH PARABOLIC RETURNS FOR IMPROVED ACCESS

[75] Inventors: Michael A. Morich, Mentor; Labros Petropoulos, Cleveland Heights; David A. Lampman, Eastlake, all of Ohio

[73] Assignee: Picker International, Inc., Highland Hts., Ohio

[21] Appl. No.: 286,887

[22] Filed: Aug. 5, 1994

[51] Int. Cl.$^6$ ............................................. G01V 3/00
[52] U.S. Cl. ............................. 324/318; 128/653.5
[58] Field of Search ............................. 324/318, 322, 324/313, 314, 307, 309, 319; 128/653.5

[56] References Cited

U.S. PATENT DOCUMENTS

| | | | |
|---|---|---|---|
| 4,617,516 | 10/1986 | Schenck | 324/318 |
| 4,646,024 | 2/1987 | Schenck et al. | 324/318 |
| 4,737,716 | 4/1988 | Roemer | 324/319 |
| 4,758,813 | 7/1988 | Holsinger et al. | 335/306 |
| 5,036,282 | 7/1991 | Morich et al. | 324/318 |
| 5,177,442 | 1/1993 | Roemer | 324/322 |
| 5,185,576 | 2/1993 | Varek et al. | 324/318 |
| 5,278,504 | 1/1994 | Patrick et al. | 324/318 |
| 5,309,107 | 5/1994 | Pausch | 324/322 |
| 5,347,220 | 9/1994 | Van Heelsbergen | 324/322 |

OTHER PUBLICATIONS

"Torque Compensated Asymmetric Gradient Coils for EPI", Abduljalil, et al., SMRM 12th Annual Meeting, vol. 3, p. 1306 Aug. 1993.
"A Torque–Balanced, Asymmetric Gradient Coil for Imaging of the Brain", Alsop, SMRM 12th Annual Meeting, p. 1359 Aug. 1993.
"NMR Imaging in Biomedicine, Supplement 2," Mansfield, et al., pp. 268–269 (1982) (month unknown).
"High Speeed High Field, Planar Surface Gradient Assembly for Fast Imaging", Roemer, et al., p. 134 (date unknown).
"Insertable Biplanar Gradient Coils for Magnetic Resonance Imaging", Martens, et al., Rev. Sci. Instrum. 62 (11) Nov. 1991, pp. 2639–2644.
"Compact Magnet and Gradient System for Breast Imaging", Pissanetzky, et al., SMRM 12th Annual Meeting, p. 1304 (1993) (month unknown).
"High–Order, Multi–Dimensional Design of Distributed Surface Gradient Coil", Oh, et al., SMRM 12th Annual Meeting, p. 1310 (date unknown)

*Primary Examiner*—Louis M. Arana
*Attorney, Agent, or Firm*—Fay, Sharpe, Beall, Fagan, Minnich & McKee

[57] ABSTRACT

An insertable coil (40) is inserted in a bore (12) of a magnetic resonance imaging apparatus. Primary field magnets (10) create a temporally constant magnetic field longitudinally through the insertable coil. A computer control (58) controls a radio frequency coil (46) and a gradient coil (42) to create magnetic resonance imaging sequences and process received magnetic resonance signals into image representations. The insertable gradient coil includes a cylindrical, dielectric former (44) of appropriate diameter to receive a patient's head. A pair of parabolic cutouts (62) are defined adjacent a patient receiving end of the dielectric former and are of an appropriate size to receive the patient's shoulders. In this manner, the patient's head can be centered in a longer head coil. Four thumbprint type x-gradient coil windings (72) are mounted symmetrically on the dielectric former with the parabolic cutouts (74) centrally on one side of the thumbprint coil windings. The windings of the thumbprint coils are contoured to follow the parabolic cutout. Four y-gradient coil windings (84) rotated 90° from the x-gradient coils are mounted on the dielectric former. The y-gradient thumbprint coil windings are mounted between the parabolic cutouts and windings along their corners (82) conform to the parabola.

18 Claims, 5 Drawing Sheets

MAGNETIC RESONANCE INSERT GRADIENT COILS WITH PARABOLIC RETURNS FOR IMPROVED ACCESS

BACKGROUND OF THE INVENTION

The present invention relates to the magnetic resonance imaging art. It finds particular application in conjunction with insertable gradient coils for high speed imaging techniques and will be described with particular reference thereto.

Magnetic resonance imagers commonly include a large diameter, whole body gradient coil which surrounds a patient receiving bore. Main field magnets, either superconducting or resistive, and radio frequency transmission/reception coils also surround the bore. Although the whole body gradient coils produce excellent linear magnetic field gradients, they have several drawbacks. With large diameter gradient coils, the slew rate is sufficiently slow that it is a limiting factor on the rate at which gradient magnetic fields can be induced and changed. Large diameter whole body gradient coils have relatively low gradient field per unit drive ampere for a given inductance, which limits their use for some of the highest speed magnetic resonance imaging techniques. The energy stored in gradient coils is generally proportional to greater than the fifth power of the radius. Hence, large diameter, whole body coils require large amounts of energy. Further, superconducting main magnets have cold shields disposed around the bore. The larger the diameter of the gradient coil, the closer it is to the cold shields and hence the more apt it is to produce eddy currents. More shielding is needed to prevent the whole body gradient coils from inducing eddy currents in the cold shields than would be necessary for smaller diameter coils.

Due to these and other limitations in whole body coils, numerous insertable coils have been developed which are small enough to fit within the bore with the patient. Typically, the insertable coils are customized to a specific region of the body, such as a head coil, or a cardiac coil. Traditionally, head coils have been a cylinder sized to accommodate the human head easily, e.g. 28 cm in diameter, while cardiac coils have been biplanar sized to accommodate the human torso. Most brain examinations center around the portion of the brain that is substantially in the same plane as the eye sockets. In a symmetric coil, the magnetic and physical isocenters are both configured to be disposed in a common plane with the patient's eyes or patient's heart.

As a general rule, the longer the cylindrical head coil, the larger the region over which the gradient is linear and the more linear the region is. However, the patient's shoulders are a limiting factor on the length of a symmetric head gradient coil. The shoulders limit the isocenter to about 20 cm from the patient end. Thus, symmetric head coils have heretofore been limited to about 40 cm in length.

In order to achieve the beneficial effects of a longer head gradient coil, head coils have been designed in which the magnetic isocenter is offset toward the patient from the physical, geometric center of the coil. See, for example, U.S. Pat. No. 5,278,504 of Patrick, et al. or U.S. Pat. No. 5,177,442 of Roemer, et al. Although asymmetric head coils have beneficial effects on the linearity and the size of the linear region, the improvement is not without an offsetting difficulty. Within the main magnetic field, the asymmetric gradient coil is subject to mechanical torques from the main and gradient magnetic field interactions. In order to counteract these torques, the asymmetric head coils are mounted with rigid mechanical constraints. Even with substantial mechanical structures anchored to the main field magnet assembly, the torque still tends to cause mechanical vibration and noise.

Although conventional head gradient coils include a Maxwell pair for the z-axis or Golay saddle coils for the x or y-axes on the surface of a cylinder, others have proposed coils in which all windings do not lie on the cylinder surface. "Compact Magnet and Gradient System For Breast Imaging", S. Pissanetzky, et al., SMRM 12th Annual Meeting, p. 1304 (1993) illustrates a compact asymmetric cylinder coil bent up radially at a 90° angle at the field producing end of the coil. The coil is designed for breast imaging with the coil pressed up against the chest. "High-Order, Multi-Dimensional Design of Distributed Surface Gradient Coil", Oh, et al., SMRM 12th Annual Meeting, p. 310 (1993) attempts to optimize a gradient surface coil using current flows in three dimensions. One of the problems with the Oh surface gradient coil is that it was difficult to control the linearity. Further, the coil was difficult to manufacture due to its complicated shape and high current densities.

The present invention provides a new and improved insertable gradient coil which overcomes the above-referenced problems and others.

SUMMARY OF THE INVENTION

In accordance with the present invention, an insertable gradient coil is provided. Gradient magnetic field inducing windings are disposed adjacent a common physical and magnetic isocenter of the coil. Return windings extend symmetrically to opposite ends of the coil. At the patient receiving end of the coil, sections are cut out to receive otherwise interfering body portions. The return windings are configured to conform to the cutout portions.

In accordance with a more limited aspect of the present invention, the coil is dimensioned to receive a human head and the cutout portions are configured to receive the patient's shoulders.

In accordance with a yet more limited aspect of the present invention, the cutout portions are parabolic.

In accordance with another aspect of the invention analogous cut out sections are provided symmetrically at an opposite service end.

One advantage of the present invention is that it achieves better linearity by allowing an increase in coil length.

Another advantage of the present invention is that it provides better access for positioning the patient inside the coil.

Another advantage of the present invention resides in freedom from torque and vibrational effects.

Another advantage of the present invention resides in its higher efficiency and short rise time.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
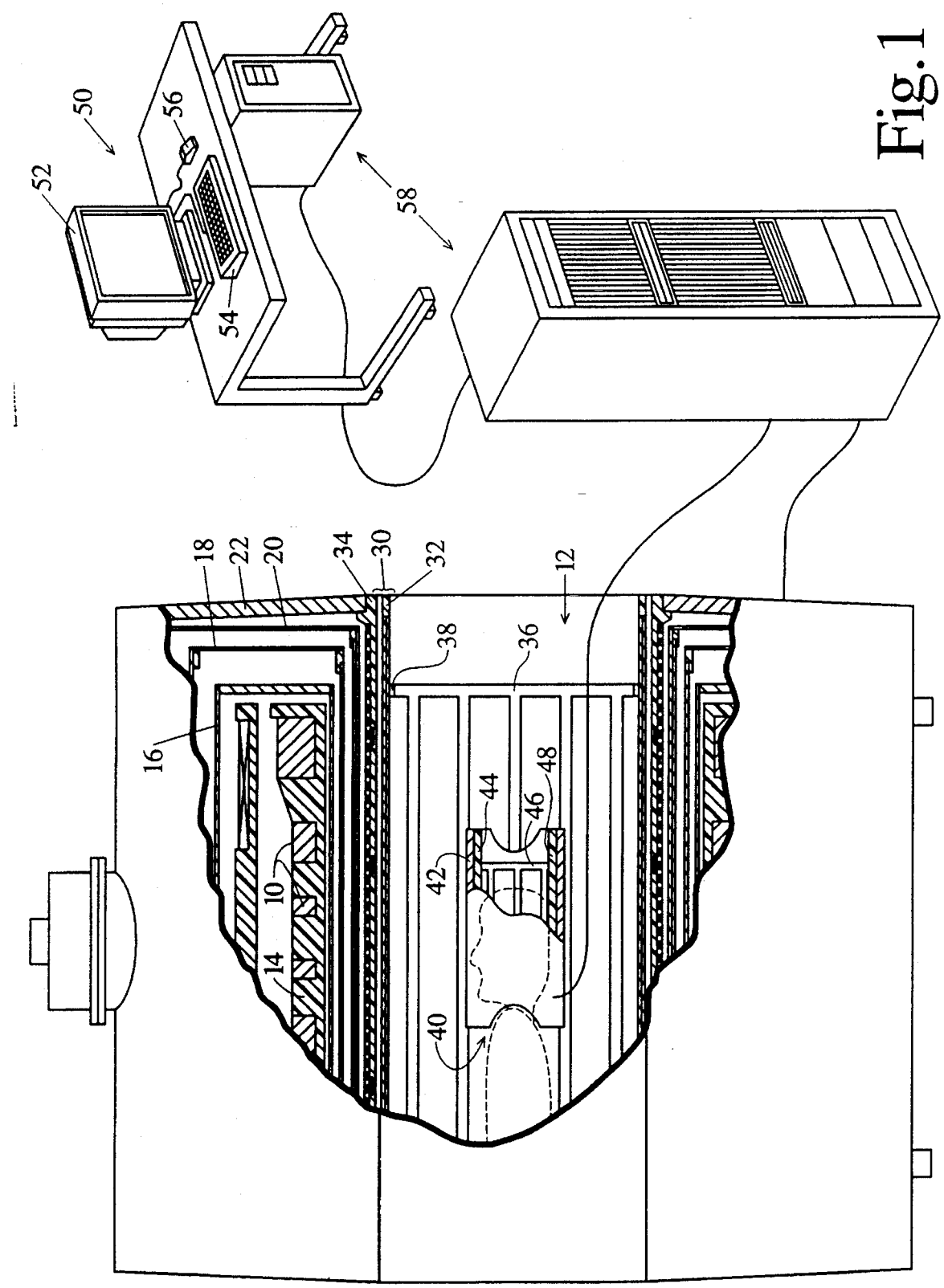
FIG. 1 is a diagrammatic illustration of a magnetic resonance imaging system including an insertable coil in accordance with the present invention.

With reference to FIG. 1, a plurality of primary magnet coils 10 generate a temporally constant magnetic field along a longitudinal or z-axis of a central bore 12. In a preferred superconducting embodiment, the primary magnet coils are supported by a former 14 and received in a toroidal helium vessel or can 16. The vessel is filled with liquid helium to maintain the primary magnet coils at superconducting temperatures. The can is surrounded by a series of cold shields 18, 20 which are supported in a vacuum dewar 22.

A whole body gradient coil assembly 30 includes x, y, and z-coils mounted along the bore 12. Preferably, the gradient coil assembly is a self-shielded gradient coil assembly that includes primary x, y, and z-coil assemblies potted in a dielectric former 32 and a secondary gradient coil assembly 34 that is supported on a bore defining cylinder of the vacuum dewar 22. A whole body RF coil 36 is mounted inside the gradient coil assembly 30. A whole body RF shield 38, e.g. copper mesh, is mounted between RF coil 36 and the gradient coil assembly 30.

An insertable head coil 40 is removably mounted in the center of the bore 12. The insertable coil assembly includes an insertable gradient coil assembly 42 supported by a dielectric former. An insertable RF coil 46 is mounted inside the dielectric former 44. An RF shield 48 is mounted between the insertable RF and gradient coils.

An operator interface and control station 50 includes a human-readable display such as a video monitor 52 and an operator input means including a keyboard 54 and a mouse 56. Computer racks 58 hold a magnetic resonance sequence, a controller reconstruction processor, and other computer hardware and software for controlling the radio frequency coils 36 and 46 and the gradient coils 30 and 42 to implement any of a multiplicity of conventional magnetic resonance imaging sequences, including echo-planar echo-volumar imaging sequences. Echo-planar and echo-volumar imaging sequences are characterized by short data acquisition times and high gradient strengths and slew rates. The racks 58 also hold a digital transmitter for providing RF excitation and resonance manipulation signals to the RF coil and a digital receiver for receiving and demodulating magnetic resonance signals. An array processor and associated software reconstruct the received magnetic resonance signals into an image representation which is stored in computer memory or on disk. A video processor selectively extracts portions of the stored reconstructed image representation and formats the data for display by the video monitor 52.

Figure 2:
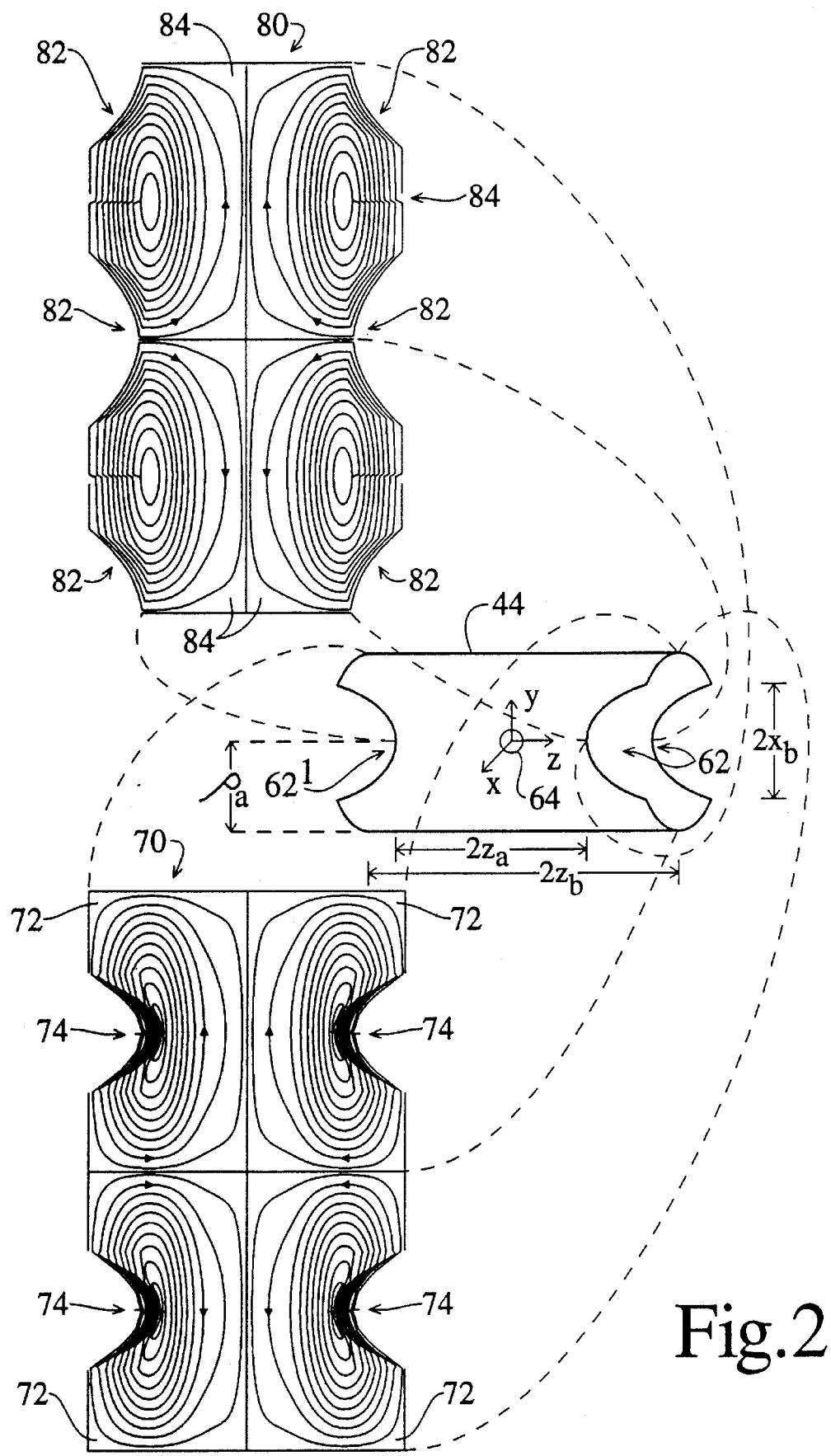
FIG. 2 is a perspective view of a head gradient coil in accordance with the present invention including a generally cylindrical dielectric former and exemplary x and y-gradient coils.

With reference to FIG. 2, the active gradient coil windings of the insertable gradient coil assembly 42 are mounted on the dielectric former 44 which, in the preferred embodiment, is circularly cylindrical. At a patient receiving end, the dielectric former has cutouts 62 shaped to conform to a patient's shoulders, parabolic in the preferred embodiment. Analogous parabolic regions 62' are defined at the opposite end for symmetry. An isocenter 64 is disposed in the geometric center of the former. The cylindrical former has an interior dimension sized to receive the human head, preferably with a radius $\rho_a$ equal to about 15 cm. Preferably, the RF screen and the RF head coil are disposed inside the radius $\rho_a$ between the subject's head and the gradient coils. The dielectric former has a length L equal to $2z_b$, with the distance between the apices of the parabolas equal to $2z_a$. The radius $\rho_a = a$ with the span of the parabolas at the edge of the cylinder equal to $2x_b$. More specifically, an azimuthal distance from the top of the parabolic section at $\phi = 0$ is denoted as $x_a = 0.0$. The numerical eccentricity of the parabola is $\epsilon = 1$. The axial distance of the end point of the parabolic section to the geometric center of the coil is denoted by $z_b$ and coincides with the half length of the coil. The azimuthal distance from the end point of the parabolic section to the $\phi = 0$ position is denoted by $x_b = \rho_a \cdot \phi_b$. The latus rectum parameter p of the parabolic section is defined for the parabolic x-gradient coil as:

$$p = \frac{1}{2} \frac{x_b^2}{z_b - z_a}. \tag{1}$$

This geometric shape for the gradient coil is symmetric, hence the overall torque is equal to zero. The imaging volume of the coil, i.e. the region with the best linearity and uniformity covers the entire human head and is centered on the brain. Due to the symmetry of the current density of the coil, its stored magnetic energy is less than the corresponding stored energy in an asymmetric gradient coil with the same specifications. The extended return path length permits lower turns densities compared to symmetric coil designs of 40 cm length and comparable gradient field specifications.

A first step in designing the x-gradient coil is to define the configuration of a traditional finite-size transverse x-gradient coil with radius $\rho_a$ and total length L. The design of this type of gradient coil generates a gradient field which is anti-symmetric in the x-direction around the isocenter of the coil and is symmetric in the y and z-directions. Due to the finite length of the coil, the current density is expanded in terms of the sine and cosine Fourier series. Due to the symmetric conditions along the axial z-direction, only cosine Fourier series expansion is required. For this step and due to the symmetry conditions, the current density is constrained to lie on the surface of the cylinder and the resulting current density is constructed as a vector addition of two components. One component lies along an axial direction $J_z(\phi,z)$ and the other component lies along the azimuthal direction $J_\phi(\phi,z)$. Using the continuity equation in order to relate both components of the current density and expressing the z-component of the magnetic field $B_z$ and the stored magnetic energy W in terms of either of these two components of the current density, a functional E is constructed in terms of W and $B_z$ as:

$$E(j_n^a) = W - \sum_{j=1}^{N} \lambda_j(B_z(\vec{r_j}) - B_{zSC}(\vec{r_j})), \tag{2}$$

where $\lambda_j$ are the Lagrange multipliers and $B_{zSC}$ represent the constraint values of the z-component of the magnetic field at the specified N points. TABLE 1 displays the position of the constraint points n=1,2,3 and the value of the gradient field at each point.

TABLE 1

| n | $\rho_i$ | $z_i$ | $B_{zSC}$ |
|---|---|---|---|
| 1 | 0.001 | 0.000 | 0.00004000 |
| 2 | 0.145 | 0.000 | 0.00580000 |
| 3 | 0.001 | 0.100 | 0.00004060 |

There are two constraint points along the x-axis of the gradient field to ensure the on-axis linearity of the gradient field. A third constraint point is located at the borders of the imaging volume on a plane which is perpendicular to the imaging axis x and controls the off-axis uniformity of the gradient field. Minimizing E, a quadratic function of the current with respect to the current coefficients $j_n^a$, one obtains a matrix equation which $j_n^a$ must satisfy:

$$\sum_{n'=1}^{\infty} j_{n'}^a \left\{ \frac{aL\pi}{2} \int_{-\infty}^{\infty} dk\, I_1(ka)K'_1(ka)\psi_n(k)\psi_{n'}(k) \right\} =$$

$$\sum_{j=1}^{N} \lambda_j \cos(\phi_j) \int_{-\infty}^{\infty} dk\, k \cos kz_j\, I_1(k\rho_j) K'_1(ka)\psi_n(k)$$

where $a=\rho_a, \psi_n(k)$ are functions which contain information about the system. See for example, U.S. Pat. No. 5,296,810 of Morich. The evaluation of the Lagrange multipliers is done via the constraint equation. Inverting Equation (3), one obtains a solution for $j_n^a$ and hence for the current density. Once these coefficients have been determined, the stored magnetic energy and the magnetic field at any point in space is calculated.

In order to discretize the above-calculated continuous function, consider the continuity equation for the current density:

$$\vec{\nabla} \cdot \vec{J} = 0 \qquad (4).$$

Analogously with the magnetic field, where a vector potential is introduced, the current density is expressed as the curl of the function $\vec{S}$, called a "stream function". Specifically:

$$\vec{J} = \vec{\nabla} \times \vec{S} \qquad (5).$$

Because the current is restricted to flow on the surface of a cylinder with radius $a=\rho_a$ and has only angular and axial dependence, the relation between the current density and the stream function in cylindrical coordinates is:

$$j_\phi^a(\phi,z)\hat{\alpha}_\phi + j_z^a(\phi,z)\hat{\alpha}_z = \frac{\partial S_\rho}{\partial z}\hat{\alpha}_\phi - \frac{1}{a}\frac{\partial S_\rho}{\partial \phi}\hat{\alpha}_z, \qquad (6)$$

and $S_\rho$ is found from:

$$S_\rho(\phi,z) = -a \int_{-\pi}^{\phi} d\phi'\, j_z^a(\phi',z). \qquad (7)$$

The contour plots of the current density are determined by:

$$S_\rho(\phi,z) = \left(n - \frac{1}{2}\right) S_{inc} + S_{min} \text{ for } n=1,\ldots,N, \qquad (8)$$

where N is the number of current contours, $S_{min}$ is the minimum value of the current density, and $S_{inc}$ represents the amount of the current between two contour lines. The determination of $S_{inc}$ is:

$$S_{inc} = \frac{S_{max} - S_{min}}{N}, \qquad (9)$$

with $S_{max}$ representing the maximum value of the current density. The contours which are generated by this method follow the flow of the current and the distance between them corresponds to a current equal to an amount of $S_{inc}$ in amps. In the manufacturing process, discrete wires are positioned to coincide with these contour lines.

This process, of course, generates a discrete current pattern which lies on a surface of a cylinder. The next step of the process is to produce a current distribution which accommodates the parabolic cutout, i.e., a parabolic x-gradient coil configuration.

Figure 3:
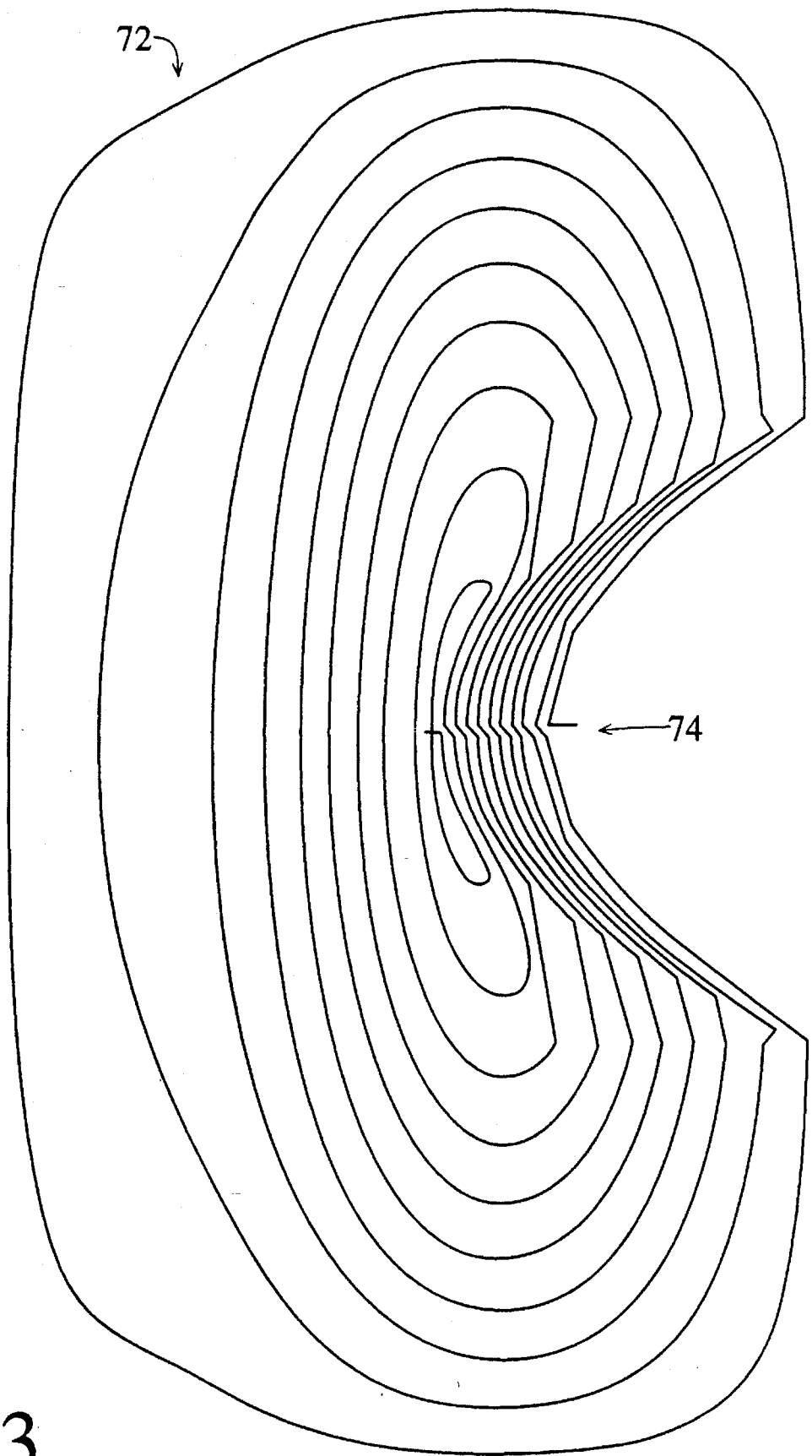
FIG. 3 is a detailed illustration of one of four symmetric quadrants of the x-gradient coil in accordance with the present invention.

Starting with the original cylindrical surface, coordinates of the starting point for the parabolic section are chosen. These coordinates are represented by a vector expression $(\rho_a, 0.0, z_a)$. Up to this point, every segment for the original current patterns remains unchanged. The only current segments that are constrained to follow the parabolic path are those which are included inside the rectangular area which is bounded by the vectors $(0.0, z_a)$ as the lower limit and $(x_b=\rho_a\cdot\phi_b, z_b)$ as the upper limit. Inside this rectangular area, any point of the current segments is constrained to follow a parabola which is defined by the equation:

$$z_p = z_a + \frac{z_b - z_a}{(\rho_a\phi_b)^2}(\rho_a\phi_p)^2, \qquad (10)$$

where $(x_p=\rho_a\,\phi_p, z_p)$ represent the coordinates for any point inside the rectangular section. In this manner, a discrete current pattern for the transverse x-gradient coil is generated which is confined to a two-dimensional surface with a parabolic aperture in the center region of the coil return paths. FIG. 3 illustrates one of four symmetric quadrants of the x-gradient coil.

In order to evaluate the magnetic field for the parabolic x-gradient coil for the discrete current distribution, one uses the Biot-Savart law:

$$B_z = \frac{\mu_0 I}{4\pi} \int_{l_1}^{l_2} \frac{(\vec{dl} \times (\vec{r}-\vec{r}'))_z}{|\vec{r}-\vec{r}'|^3}. \qquad (11)$$

The area of integration includes only the region with the cylindrical surface. In this case, the current is restricted to flow on a cylindrical surface $\rho=\rho_a$. Thus, each current segment is only a function of the azimuthal $\phi$ and axial z-directions. Thus, the expressed magnetic field which resulted from the current pattern is:

$$B_z = \frac{\mu_0 I}{4\pi} \int_{\phi_1}^{\phi_2} d\phi' \left\{ \frac{\rho_a^2 - \rho\rho_a\cos(\phi-\phi')}{[\rho_a^2 + \rho^2 - 2\rho\rho_a\cos(\phi-\phi') + (z\pm z')^2]^{3/2}} + \frac{\rho_a^2 - \rho\rho_a\cos(\phi+\phi')}{[\rho_a^2 + \rho^2 - 2\rho\rho_a\cos(\phi+\phi') + (z\pm z')^2]^{3/2}} - \frac{\rho_a^2 + \rho\rho_a\cos(\phi-\phi')}{[\rho_a^2 + \rho^2 + 2\rho\rho_a\cos(\phi-\phi') + (z\pm z')^2]^{3/2}} - \frac{\rho_a^2 + \rho\rho_a\cos(\phi+\phi')}{[\rho_a^2 + \rho^2 + 2\rho\rho_a\cos(\phi+\phi') + (z\pm z')^2]^{3/2}} \right\}, \qquad (12)$$

where $$z' = z_1 + \frac{z_2 - z_1}{\phi_2 - \phi_1} (\phi' - \phi_1), \quad (13)$$

with $z_1, \phi_1$ representing the coordinates of the origin for each line segment at the discrete current distribution, and $z_2, \phi_2$ corresponding to the coordinates of the end point for the same line segment.

With particular reference to FIGS. 2 and 3, a parabolic x-gradient coil 70 lies on a cylindrical surface of the former 44. The x-gradient coil includes four like thumbprint coil windings 72 each with a parabolic aperture 74 for the return paths of the current patterns. Each of the four coil windings is laminate to one of four symmetric quadrants on the cylindrical former. The radius of the cylinder in the preferred embodiment is $\rho_a$=0.1579 meters. The total length of the coil of the preferred embodiment is L=0.6 meters. The distance from the geometric center of the coil to the top of the parabola is preferably $z_a$=0.20 meters. The maximum azimuthal distance $x_b$ is preferably 0.1 meters and the axial distance $z_b$ is preferably 0.3 meters. A coil of this configuration generates a 37.8 mT/m gradient strength over a 25 cm diameter spherical volume at 220 amps and stores 2.005 Joules of energy.

Figure 4:
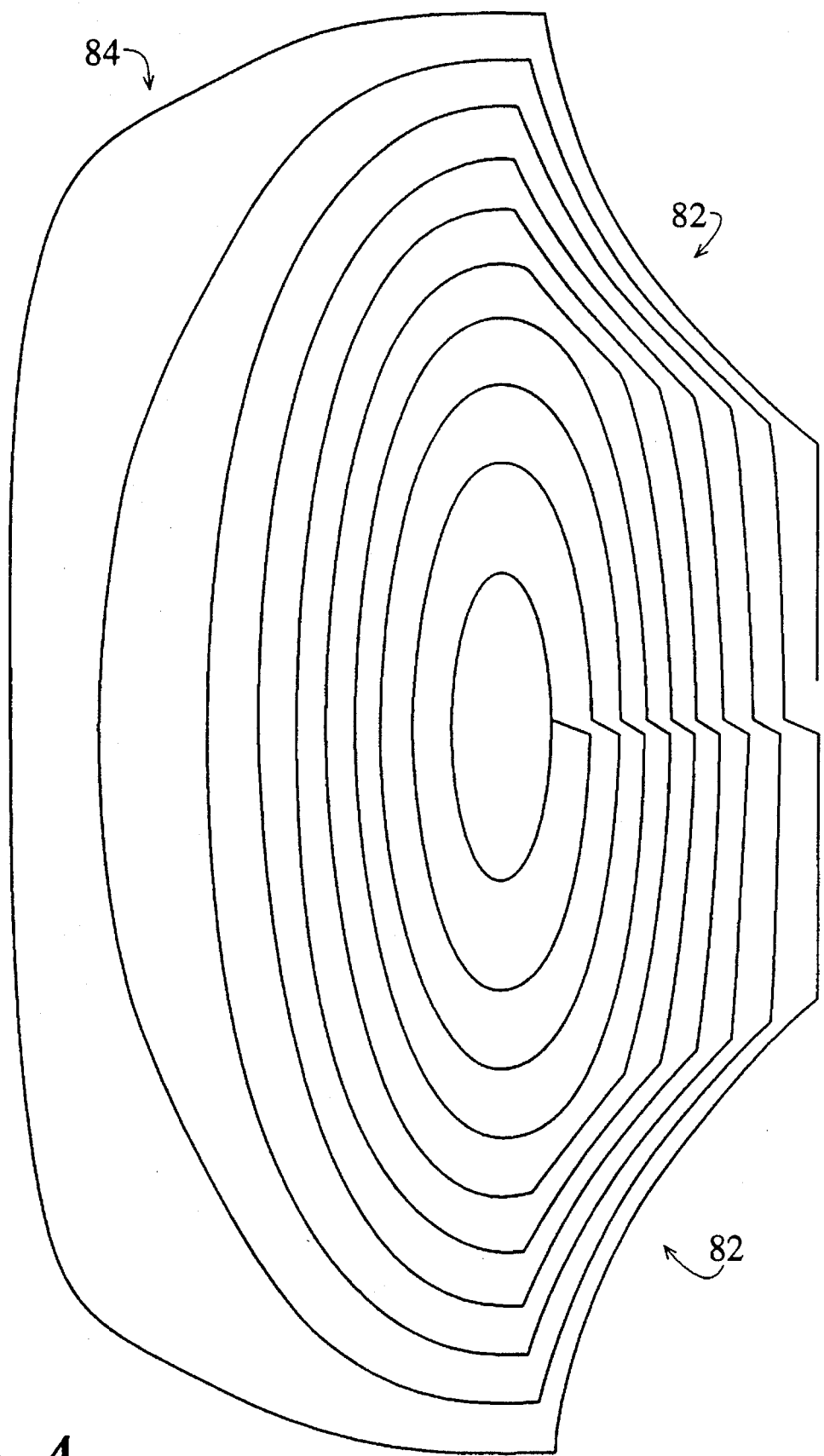
FIG. 4 is a detailed illustration of one of four symmetric quadrants of the y-gradient coil in accordance with the present invention; and, FIG. 5 is a perspective view of an alternate embodiment of a head coil in accordance with the present invention.

With reference to FIGS. 2 and 4, a y-gradient coil 80 is again sized to wrap around the former 60 of length L and radius $\rho_a$. However, the y-gradient coil is rotated 90° around the cylinder from the x-gradient coil 70, i.e., the azimuthal distance from the top of the parabolic section to the $\phi=\pi/2$ position is denoted by $y_a = \rho_a \cdot \pi/2$. The azimuthal distance from the end point of the parabolic section to the $\phi=0$ position is denoted by $y_b = \rho_a \cdot \phi_b$. The latus rectum p of the parabolic section for the y-gradient coil is defined as:

$$p = \frac{1}{2} \frac{z_b - z_a}{(y_b - y_a)^2}, \quad (14)$$

with $z_b < z_a$.

Initially, design of the y-gradient coil starts with the configuration of a traditional finite transverse y-gradient coil of radius $\rho_a$ and total length L. The design of this type of gradient coil generates a gradient field which is anti-symmetric in the y-direction around the geometric center of this coil and is symmetric along the x and z-directions. Due to the finite length of this gradient coil, the current density is expanded in terms of the sine and cosine Fourier series. Due to the symmetry along the axial or z-direction, only cosine Fourier series expansion terms are needed. Due to this symmetry and because the current density is constrained to lie on the surface of the cylinder, the resulting current density is constructed as the vector addition of two components. One along the axial direction $J_z(\phi, z)$ and the other along the azimuthal direction $J_\phi(\phi, z)$. Using the continuity equation in order to relate both components of the current density and expressing the z-component of the magnetic field $B_z$ and the stored magnetic energy W in terms of either one of the two components of the current density, the functional E in terms of W and B is again defined by Equation (2). TABLE 2 illustrates the constraint points and the value of the gradient field for the y-gradient coil.

TABLE 2

| n | $\rho_i$ | $\phi_i$ | $Z_i$ | $B_{zSC}$ |
|---|---|---|---|---|
| 1 | 0.001 | $\pi/2$ | 0.000 | 0.00004000 |
| 2 | 0.145 | $\pi/2$ | 0.000 | 0.00580000 |

TABLE 2-continued

| n | $\rho_i$ | $\phi_i$ | $Z_i$ | $B_{zSC}$ |
|---|---|---|---|---|
| 3 | 0.001 | $\pi/2$ | 0.100 | 0.00004060 |

Specifically, there are two constraint points along the y-axis of the gradient field to ensure the on-axis linearity and a third constraint located at the borders of the imaging volume on a plane which is perpendicular to the y imaging axis to control the off-axis uniformity of the gradient field. Minimizing E, a quadratic function of the current with respect to the coefficients $j_n^a$, one obtains the matrix equation for $j_n^a$ which satisfies:

$$\sum_{n'=1}^{\infty} j_{n'}^a \left\{ \frac{aL\pi}{2} \int_{-\infty}^{\infty} dk\, I'_1(ka) K'_1(ka) \psi_n(k) \psi_{n'}(k) \right\} = \quad (15)$$

$$\sum_{j=1}^{N} \lambda_j \sin(\phi_j) \int_{-\infty}^{\infty} dk\, k \cos kz_j\, I_1(k\rho_j) K'_1(ka) \psi_n(k)$$

where $a = \rho_a$, $\psi_n(k)$ are functions which contain information about the geometry of the system. Again, see U.S. Pat. No. 5,296,810. The evaluation of the Lagrange multipliers is done via the constraint equation. Inverting this matrix equation, one obtains the solution for $j_n^a$ and hence for the current density. Once these coefficients are determined, one can calculate the stored magnetic energy and magnetic field at any point in the volume.

In order to convert the continuous function solution to a discrete current pattern, one considers Equation (4), the continuity equation for the current density. In analogy with the magnetic field where a vector potential is introduced, the current density can again be expressed as a function $\vec{s}$, called a "stream function" as described in Equation (5). Because the current is restricted to flow on the surface of a cylinder of radius $a = \rho_a$ and has only angular and axial dependence, the relation between the current density and the stream function in cylindrical coordinates is again given by Equations (6) and (7). The contour plots are again determined by Equation (8), where N is the number of contour curves, $S_{min}$ is the minimum value of the current density, and $S_{inc}$ represents the amount of current between the two contour lines. The determination of $S_{inc}$ is again found in accordance with Equation (9). The contours which are generated by this method follow the flow of the current and the distance between them corresponds to a current equal to an amount of $S_{inc}$ in amps. Discrete wires are positioned in such a way as to coincide with these contour lines. This, of course, generates a discrete current pattern which lies on the surface of a cylinder. The next process is to redistribute the current to accommodate the parabolic cutouts 62 at the corners 82 of each of four like thumbprint windings 84 of the y-gradient coil configuration.

Starting with the original cylindrical surface, the coordinates of the starting point of the parabolic section 82 are selected. These coordinates are represented by the vector expression $(\rho_a, \rho_a \cdot \pi/2, z_a)$. The only current segments that are constrained to follow the parabolic path are those which are included inside the rectangular area which is bounded by the vectors $(y_a = \rho_a \cdot \pi/2, z_a)$ as the lower limit and $(y_b = \rho_a \cdot \phi_b, z_b)$ as the upper limit. The other current segments remain the same. Inside the rectangular area at any point, the current segment is constrained to follow a parabola which is defined by the equation:

$$y_p = y_a - (y_b - y_a)\sqrt{\frac{|z_p - z_a|}{|z_b - z_a|}}, \quad (16)$$

where $(y_p=\rho_a \cdot \phi_p, z_p)$ represents the coordinates for any point inside the rectangular section. In this manner, a discrete pattern for the parabolic y-gradient coil is generated. The discrete pattern is confined to a two-dimensional surface with parabolic apertures at the corners of each coil quadrant 84 as illustrated in FIG. 4.

In order to evaluate the magnetic field for the parabolic gradient from the discrete current distribution, we use the Biot-Savart law as set forth in Equation (11). The area of integration includes only the region with the cylindrical surface, not the region with the parabolic shoulder accommodating regions. In this case, the current is restricted to flow on a cylindrical surface $\rho=\rho_a$ and each current segment is only a function of the azimuthal direction $\phi$ in the axial direction z. In a preferred embodiment, the y-gradient coil has a radius of $\rho_a=0.1591$ meters and a length L=0.6 meters. The distance from the geometric center of the coil to the top of the parabola is $z_a=0.2$ meters and the azimuthal distance is $y_b=0.13$ meters and the corresponding axial distance is $z_b=0.3$ meters. A coil of this configuration generates a 39.5 mT/m gradient strength over a 25 cm. diameter spherical volume, at 220 amps and stores 2.07 Joules of energy.

Suitable z-gradient coils are illustrated in parent applications 08/269,393 and 08/213,099. The z-gradients of suitable linearity are achieved with a coil of these configurations and a length of 0.4 meters, the distance between the parabolic cutouts (also the length of many prior art head coils).

Figure 5:
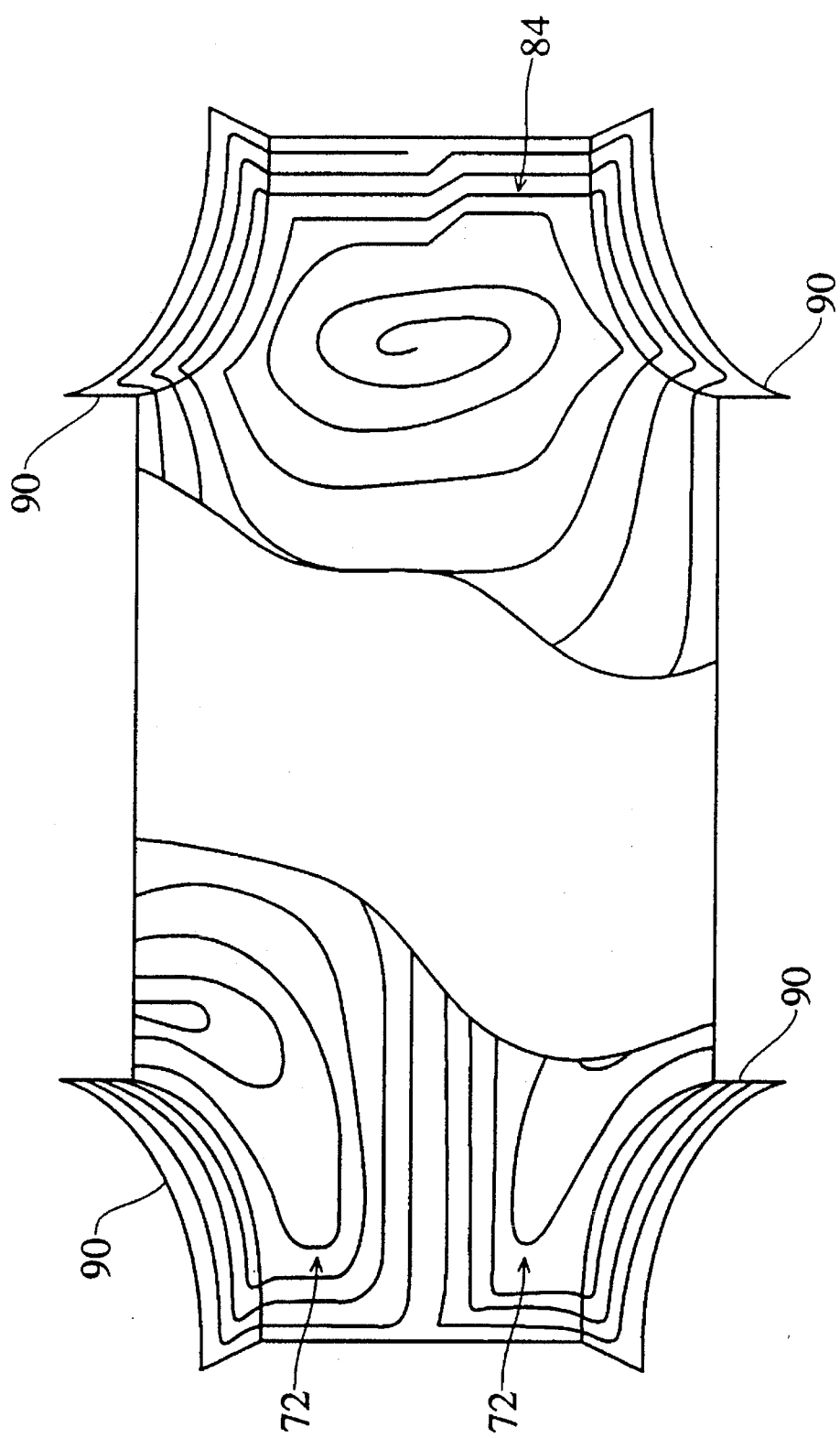

With reference to FIG. 5, the repositioned return windings adjacent the parabolic shoulder cutouts can be raised off the surface of the cylinder. The former has flared parabolic sections or extensions 90 mounted adjacent the shoulder cutout and extending over the patient's shoulders. Mounting the return windings on these flared portions enables the return windings to be physically spaced more distantly.

It is to be recognized by those skilled in the art that a more conventional distributed or bunched z-gradient coil design can be configured with the parabolic x and y-gradients to form a three axis set. The z-gradient is constrained to less than 40 cm in overall length to avoid impinging upon the shoulder access region and preferentially resides at the largest of the three coil diameters due to its inherently high efficiency.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In an insertable gradient coil assembly for a magnetic resonance imaging apparatus, which insertable gradient coil assembly includes a dielectric cylinder having an interior bore dimensioned to receive a region of interest of the subject to be imaged, the cylinder carrying gradient coils for generating linear magnetic field gradients through the region of interest, the gradient coils being mounted symmetrically relative to an isocenter of the gradient coil assembly such that the generation of magnetic field gradients exerts substantially no net torque on the gradient coil assembly, the improvement comprising:

at least one cutout region defined adjacent a first end of the cylinder for receiving a portion of the subject adjacent the region of interest, the gradient coils including contoured first winding portions which follow a contour of the cutout region and contoured second winding portions adjacent a second end of the cylinder, the contoured second winding portions being mirror image symmetric with respect to the contoured first winding portions about the isocenter to cancel torques exerted on the gradient coil assembly due to the contoured first winding portions.

2. In the insertable gradient coil assembly of claim 1, the improvement further comprising:

the at least one cutout region of the cylinder including a pair of parabolic cutout regions, the contoured first winding portions of the gradient coils extending along parabolic paths adjacent an edge of the parabolic cutouts and the contoured second winding portions extending along symmetric parabolic paths.

3. In an insertable gradient coil for a magnetic resonance imaging apparatus, which insertable gradient coil includes a dielectric former having an interior bore dimensioned to receive a region of interest of the subject to be imaged, the dielectric former carrying winding portions for creating linear magnetic field gradients through the region of interest, the improvement further comprising:

at least one cutout region defined adjacent an end of the cylinder for receiving a portion of the subject adjacent the region of interest, flared portions extending outward from the cylinder adjacent the cutout region, the gradient coil winding portions extending in part on the flared portions.

4. A gradient magnetic field coil assembly for a magnetic resonance imaging apparatus, the gradient field coil assembly comprising:

a dielectric former configured to receive a selected portion of a patient for imaging;

the dielectric former having at least one removed portion configured for accommodating an adjacent portion of the patient to permit the selected portion of the patient to be received more completely within the dielectric former;

symmetric gradient coil assembly for generating magnetic field gradients within the dielectric former, the gradient coil assembly including loops mounted to the dielectric former, which loops are contoured to skirt the at least one removed portion and which loops are sufficiently symmetric relative to an isocenter plane of the gradient coil assembly that torques on the gradient coil assembly exerted by the loops on opposite sides of the isocenter plane cancel.

5. The gradient coil assembly as set forth in claim 4 wherein the dielectric former is cylindrical.

6. The gradient coil assembly as set forth in claim 4 wherein the dielectric former is dimensioned for receiving the patient's head and wherein the at least one cutout portion includes a pair of cutout portions disposed adjacent a patient receiving end of the dielectric former for receiving a patient's shoulders.

7. A magnetic field gradient coil assembly for a magnetic resonance imaging apparatus, the gradient field coil assembly comprising:

a dielectric former configured to receive a selected region of a patient for imaging;

four symmetric x-gradient coil windings, each of the four x-gradient coil windings being disposed on an x-gradient quadrant of the cylinder symmetrically about an isocenter of the gradient coil assembly;

four symmetric y-gradient windings, the four y-gradient windings each being disposed symmetrically on a y-gradient quadrant of the cylinder symmetrically about the isocenter of the gradient coil assembly, the x and y-gradient windings being disposed overlapping and 90° offset circumferentially around the cylinder;

the dielectric former having a pair of removed portions adjacent a first end for receiving a portion of the patient adjacent the selected region to permit the selected region of the patient to be received within the dielectric former at the isocenter of the gradient coil assembly;

portions of the x-gradient coil windings and the y-gradient coil windings adjacent the first end extending along first curved paths that skirt the pair of removed portions, portions of the x-gradient coil windings and the y-gradient coil windings adjacent a second end of the dielectric former extending along second curved paths that are symmetric about the isocenter with the first curved paths.

8. The gradient coil assembly as set forth in claim 7 wherein the dielectric former is cylindrical.

9. The gradient coil assembly as set forth in claim 8 wherein the pair of removed portions are disposed centrally in an edge of a pair of quadrants of the x-gradient windings at the first end and adjacent corners of a pair of quadrants of the y-gradient coil windings.

10. The gradient coil assembly as set forth in claim 7 wherein the first and second curved paths are parabolic.

11. A magnetic resonance imaging system comprising:

a primary magnetic field assembly for generating a temporally constant magnetic field through a central bore thereof;

a whole body gradient coil assembly disposed around the central bore;

a radio frequency coil assembly disposed around the central bore;

a head coil removably mounted in the central bore, the head coil including:
  a cylindrical former, which cylindrical former has a pair of cutouts which substantially conform to a patient's shoulders,
  a first plurality of gradient coil winding loops extending around the cylindrical former, regions of the gradient coil winding loops disposed adjacent the cutouts following a contour of the cutouts, the gradient coil winding loops being symmetric about a plane transverse to a central axis of the cylindrical former and intersecting a gradient magnetic field isocenter such that torques exerted on the gradient coil winding loops by generated gradients cancel, and
  an RF coil supported by the cylindrical former;

a magnetic resonance excitation controller for controlling the head coil including the plurality of gradient coil windings and the RF coil for inducing magnetic resonance within the cylindrical former and for receiving magnetic resonance signals therefrom;

a reconstruction processor for reconstructing the received magnetic resonance signals into an image representation.

12. The magnetic resonance imaging system as set forth in claim 11 wherein the first plurality of gradient coil windings loops includes a first four symmetric gradient coil winding patterns, each extending over half a length of the cylindrical former and 180° around the cylindrical former.

13. The magnetic resonance imaging system as set forth in claim 12 wherein two of the gradient coil winding patterns are centered on the shoulder receiving cutouts.

14. The magnetic resonance imaging system as set forth in claim 12 wherein two of the gradient coil winding patterns are disposed substantially between the pair of cutout portions with the cutout contour following regions adjacent corners thereof.

15. The magnetic resonance imaging system as set forth in claim 12 further including a second plurality of gradient coil winding loops including a second four symmetric gradient coil winding patterns which are mounted rotated 90° around the cylindrical former from the first four symmetric gradient winding patterns.

16. The magnetic resonance imaging system as set forth in claim 12 wherein the gradient coil winding patterns are each thumbprint winding pattern.

17. The magnetic resonance imaging system as set forth in claim 11 wherein the cylindrical former further includes flared portions extending outward from the cylindrical former and around the cutouts, the gradient coil winding loops extending in part along the flared portions.

18. The magnetic resonance imaging system as set forth in claim 17 wherein the cutouts are parabolic.

* * * * *